US012652759B2

(12) United States Patent
Chen et al.

(10) Patent No.: US 12,652,759 B2
(45) Date of Patent: Jun. 9, 2026

(54) LEADFRAME MOUNTING WITH LEAD INSERTION FOR LEAD WALL BONDING

(71) Applicant: SEMICONDUCTOR COMPONENTS INDUSTRIES, LLC, Phoenix, AZ (US)

(72) Inventors: Chad Chen, Suzhou (CN); Jiahui Liu, Suzhou (CN); Wuxing Xia, Suzhou (CN); Jingyan Liu, Suzhou (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 760 days.

(21) Appl. No.: 17/931,651

(22) Filed: Sep. 13, 2022

(65) Prior Publication Data

US 2024/0090130 A1     Mar. 14, 2024

(51) Int. Cl.
| | |
|---|---|
| *H05K 1/18* | (2026.01) |
| *H05K 3/34* | (2026.01) |
| *H05K 3/3485* | (2026.01) |
| *H05K 3/3494* | (2026.01) |
| *H10W 70/40* | (2026.01) |
| *H05K 3/341* | (2026.01) |

(52) U.S. Cl.
CPC ............. *H05K 1/18* (2013.01); *H05K 3/3485* (2020.08); *H05K 3/3494* (2013.01); *H10W 70/429* (2026.01); *H05K 3/3426* (2013.01); *H05K 2201/10757* (2013.01); *H05K 2201/10863* (2013.01); *H05K 2201/10878* (2013.01); *H05K 2201/10946* (2013.01)

(58) Field of Classification Search
CPC ...... H05K 1/18; H05K 3/3485; H05K 3/3494;
H05K 2201/10757; H05K 2201/10863;
H05K 2201/10878; H05K 2201/10946;
H05K 1/111; H05K 1/181; H05K 3/3426;
H05K 2201/09745; H05K 2201/10901;
H05K 7/10; H01L 23/49555; H01L
24/40; H01L 23/3735; H01L 23/49517;
H01L 23/142; H01L 23/49811; H01L
23/522
See application file for complete search history.

(56) References Cited

U.S. PATENT DOCUMENTS

| | | | | |
|---|---|---|---|---|
| 6,350,632 | B1 * | 2/2002 | Lin | ......................... H01L 24/13 |
| | | | | 257/E23.068 |
| 11,145,571 | B2 * | 10/2021 | Yoo | ..................... H01L 21/4882 |
| 11,469,205 | B2 * | 10/2022 | Williams | .............. H01L 21/561 |
| 12,096,105 | B2 * | 9/2024 | Lee | ......................... H05K 1/181 |
| 12,132,027 | B2 * | 10/2024 | Baello | ................. H01L 23/4952 |
| 2002/0179685 | A1 | 12/2002 | Jung et al. | |
| 2006/0049523 | A1 * | 3/2006 | Lin | ................... H01L 23/49811 |
| | | | | 257/E23.068 |

(Continued)

*Primary Examiner* — Yara B Green
*Assistant Examiner* — Benjamin Michael Kupp
(74) *Attorney, Agent, or Firm* — Brake Hughes Bellermann LLP

(57) ABSTRACT

A semiconductor device package may include a substrate having an insulating layer with a patterned conductive layer formed thereon, the patterned conductive layer including at least a first pattern portion and a second pattern portion. The semiconductor device package may include a leadframe having a lead that is soldered to the substrate with solder provided in an opening between the first pattern portion and the second pattern portion and with the lead inserted into the opening.

20 Claims, 6 Drawing Sheets

(56)  References Cited

U.S. PATENT DOCUMENTS

2008/0157305  A1 *   7/2008  Liao .................. H01L 23/49555
                                                           257/676
2018/0108586  A1     4/2018  Akimoto et al.
2018/0114769  A1     4/2018  Chang et al.

* cited by examiner 306a          304          306b

Solder paste          Groove
314                    308

306a          304          306b

Solder
paste          308          Leadframe
314                         lead
                            412

Solder paste
314

308

Leadframe
lead
412

LEADFRAME MOUNTING WITH LEAD INSERTION FOR LEAD WALL BONDING

TECHNICAL FIELD

This description relates to semiconductor device packaging.

BACKGROUND

Electronic components are frequently attached to printed circuit boards (PCBs) and other mounting surfaces using solder as part of various surface mount technologies (SMTs). For example, in solder reflow processes, solder paste may be applied to pre-defined locations (e.g., contact pads) on a PCB. Then, one or more heating stages may be used to attempt to melt the solder and bond the components to the PCB, while avoiding component cracking from thermal shock, voids within the solder, and various other defects that may occur.

SUMMARY

According to one general aspect, a semiconductor device package may include a substrate having an insulating layer with a patterned conductive layer formed thereon, the patterned conductive layer including at least a first pattern portion and a second pattern portion. The semiconductor device package may include a leadframe having a lead that is soldered to the substrate with solder provided in an opening between the first pattern portion and the second pattern portion and with the lead inserted into the opening.

According to another general aspect, a semiconductor device package may include a substrate having an insulating layer with a patterned conductive layer formed thereon, the patterned conductive layer including at least a first pattern portion and a second pattern portion. The semiconductor device package may include a leadframe positioned on the patterned conductive layer and having a lead with a lead end portion that is inserted into an opening between the first pattern portion and the second pattern portion, and that is soldered to at least one wall of the opening and to the insulating layer.

According to another general aspect, a method of making a semiconductor device package may include patterning a patterned conductive layer on an insulating layer of a substrate, the patterned conductive layer including at least a first pattern portion and a second pattern portion, and applying solder paste within an opening between the first pattern portion and the second pattern portion. The method may include positioning a leadframe on the patterned conductive layer, inserting a lead of the leadframe within the solder paste, and heating the solder paste to solder bond the lead to the substrate with the lead inserted into the opening.

The details of one or more implementations are set forth in the accompanying drawings and the description below. Other features will be apparent from the description and drawings, and from the claims.

DETAILED DESCRIPTION

Described techniques and resulting semiconductor device packages are related to the use of reflow processes in which a lead of a leadframe is soldered to a bonding surface of a printed circuit board, such as a direct bonded metal (DBM) or direct bonded copper (DBC) substrate. In described techniques, one or more leads of a leadframe are inserted into a groove, hole, or other opening, prior to solder and reflow processes occurring. Consequently, leads may be attached in an easy, reliable manner, among other advantages.

In conventional scenarios related to reflow processes for mounting a leadframe, a lead of a leadframe may be attempted to be soldered to a planar surface (e.g., contact pad) of a PCB. When performed correctly, the resulting lead is substantially planar and a solder bond exists over an entirety of an interface between the lead and the contact pad. When performed using a DBM, conventional techniques seek to form this type of bond as a horizontal bond, in which the lead and the DBM surface are substantially parallel and planar.

In many cases, however, a condition known as lead open occurs, in which full solder coverage at the interface of the lead and contact pad is not achieved. For example, the lead may not be sufficiently or completely planar, e.g., may not be completely parallel with (i.e., may be angled with respect to) the underlying DBM surface. As a result, such a lack of lead planarity may lead to solder voids or may otherwise affect solder paste bond coverage and strength. Resulting semiconductor device packages may therefore be more likely to fail electrical testing requirements, to be scrapped, or to be unreliable during subsequent use.

In described techniques, however, as referenced above and described in detail, below, a leadframe lead is inserted into a groove, hole, or other opening of a DBM, DBC, or other PCB, and the solder paste bond is formed at least between the inserted lead and walls or sides of the DBM (or other PCB) formed by the opening. That is, for example, during subsequent heating and other reflow processing, the lead may be partially inserted within the DBM opening and bonded by the solder paste around the walls or sides of the DBM opening.

Thus, lead wall bonding may be achieved by inserting a leadframe lead into a DBC groove, thereby reducing a need for achieving a lead horizontal planarity. Accordingly, product quality may be improved, scrap cost may be reduced, product competitiveness may be improved, and customer dissatisfaction resulting from lead open conditions may be reduced.

Figure 1:
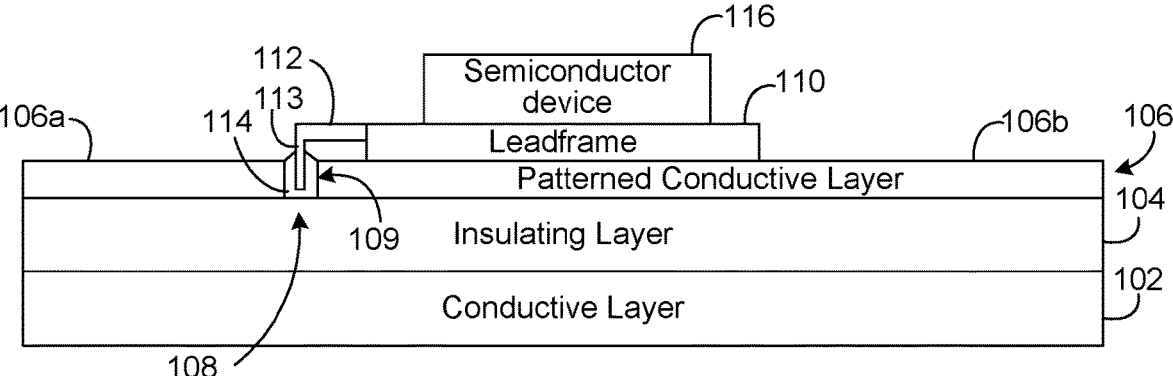
FIG. 1 is a simplified block diagram of a portion of a semiconductor device package.

FIG. 1 is a simplified block diagram of a portion of a semiconductor device package. In the example of FIG. 1, a conductive layer 102 has an insulating layer 104 formed thereon. A patterned conductive layer 106 is formed on the insulating layer 104. As shown, the patterned conductive layer 106 may be formed on a first (e.g., top) side of the insulating layer 104, and the conductive layer 102 may be formed on an opposed second (e.g., bottom) side of the insulating layer 104.

The patterned conductive layer 106 includes a first pattern portion 106a and a second pattern portion 106b, which define a groove, hole, or other opening 108 within the patterned conductive layer 106. For example, as illustrated in more detail in the example top view of FIG. 2, the patterned conductive layer 106 may be formed in virtually any desired pattern, so that any corresponding opening(s) 108 may be defined therein. As illustrated in FIG. 1, the patterned conductive layer 106 and the opening 108 define at least one wall 109 of the opening 108.

For example, the first pattern portion 106a and the second pattern portion 106b may be formed as two separate and distinct portions of the patterned conductive layer 106, and the opening 108 may be formed as a groove between the first pattern portion 106a and the second pattern portion 106b. In these examples, the opening 108 may be formed as a groove having two separate (e.g., opposed) walls 109. In other examples, the first pattern portion 106a and the second pattern portion 106b may be connected to one another, and the opening 108 may be formed as a hole having a singular or continuous wall 109.

A leadframe 110 may be disposed on the patterned conductive layer 106, e.g., on the second pattern portion 106b, as shown. The leadframe 110 may include a plurality of leads, represented in FIG. 1 by a lead 112.

As further illustrated, the lead 112 may include a lead portion 113, which may also be referred to as a lead post in some implementations, that is inserted into the opening 108. In this way, as referenced above, the lead 112 may be bonded to the wall(s) 109 of the opening 108 using solder 114, where the solder 114 may be provided at least partially on a surface of the insulating layer 104. As a result, a desired electrical connection may be established, e.g., between a semiconductor device 116 mounted on the leadframe 110 and any other component (not illustrated in FIG. 1) that is connected to the first pattern portion 106a.

Figure 2:
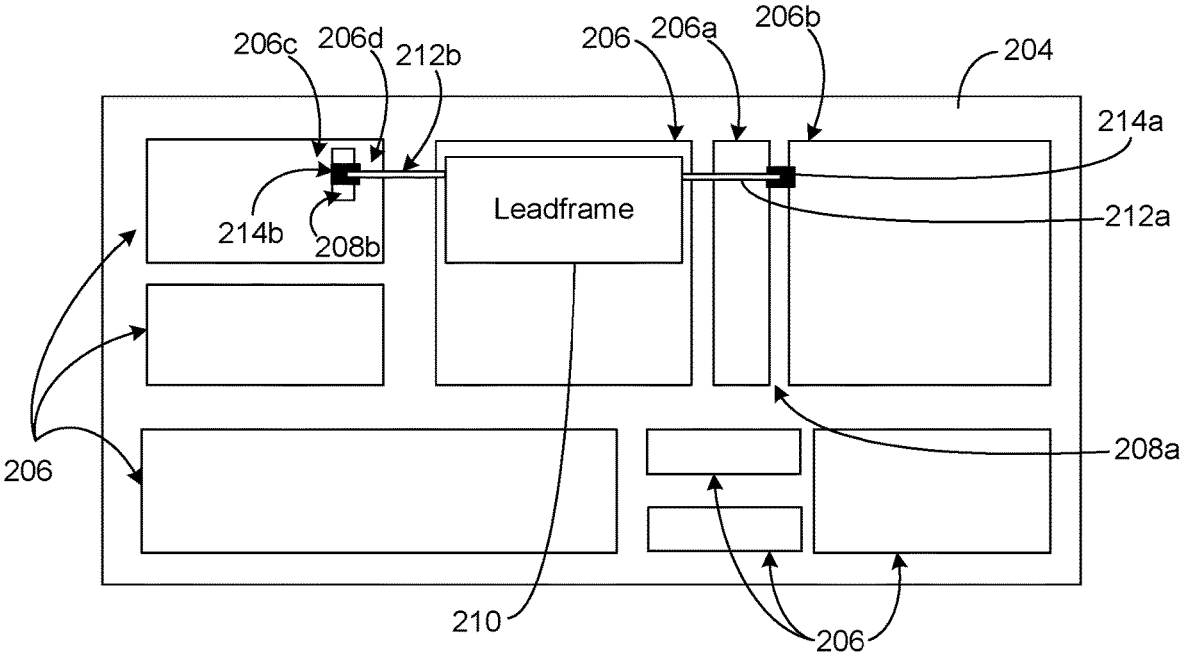
FIG. 2 is a simplified top view of an example implementation of the example of FIG. 1.
Figure 7:
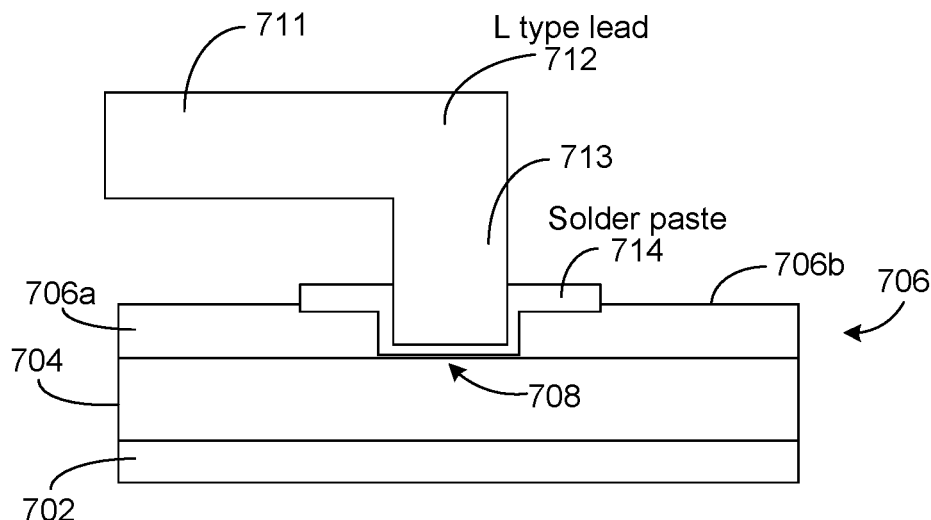
FIG. 7 is a simplified side view of a first alternate example implementation of the example of FIG. 1.
Figure 8:
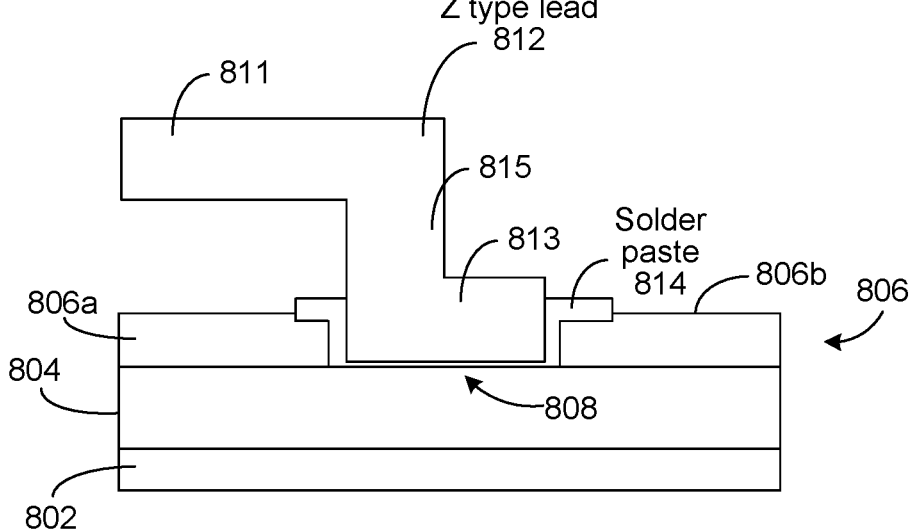
FIG. 8 is a simplified side view of a second alternate example implementation of the example of FIG. 1.

As already noted, FIG. 1 represents a simplified example to illustrate the bonding of the inserted lead 112 within the opening 108 to the patterned conductive layer 106. Consequently, the various components of FIG. 1 should not be considered to be drawn to scale or to represent any particular or required configuration of a specific semiconductor device package. To the contrary, and as illustrated in FIGS. 2, 7, and 8, many different configurations of at least the patterned conductive layer 106, the opening 108, and/or the leadframe 110 are possible. Moreover, the example of FIG. 1 should not be considered to represent a complete semiconductor device package, as many other components may be included (e.g., the structure of FIG. 1 may be encapsulated in an epoxy or other suitable molding material, and/or one or more heatsinks may be attached).

Thus, the leadframe 110 should be understood to represent any conductive structure capable of connecting individual terminal(s) of the semiconductor device 116 to larger-scale circuitry connected to the patterned conductive layer

4

106. The lead 112 is illustrated as having the above-referenced lead portion 113, but, as illustrated and described below, e.g., with respect to FIGS. 7 and 8, the lead 112 may be formed in many different shapes.

Similarly, FIG. 1 illustrates the leadframe 110 as being positioned directly on the patterned conductive layer 106, and the semiconductor device 116 is illustrated as being mounted directly on the leadframe 110. However, any suitable mounting or attachment technique may be used, and various intervening structure(s) (e.g., a heatsink) may be included as well. Additionally, the leadframe 110 may include any suitable number of leads beyond the illustrated lead 112 of FIG. 1, and/or multiple semiconductor devices may be included.

In some examples of FIG. 1, the conductive layer 102, the insulating layer 104, and the patterned conductive layer 106 may form a DBC substrate formed using copper, ceramic, and copper, respectively. However, other types of circuit boards and/or substrates may be used, as well.

In FIG. 1, the lead portion 113 may be formed and positioned to be substantially vertical with respect to (i.e., may be perpendicular to) a horizontal surface of the second pattern portion 106b upon which the leadframe 110 is mounted. However, the terms vertical and horizontal should be understood to be relative to one another, and it will be appreciated that vertical/horizontal directions of an actual semiconductor device package will depend on an overall orientation of the semiconductor device package.

Figure 6:
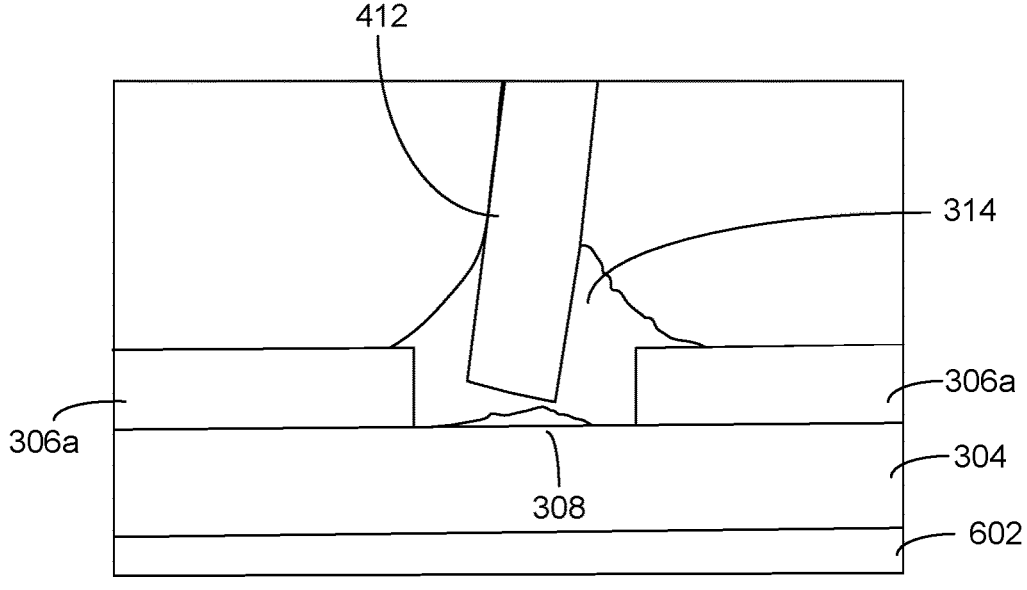
FIG. 6 is a side view of the example of FIG. 5.

Moreover, as illustrated in the example of FIG. 6, the lead portion 113 need not be positioned exactly at a right angle with respect to the surface of the patterned conductive layer 106, or exactly parallel to the wall 109. Instead, an exact orientation of the lead 112 may depend on a placement of the leadframe 112, an insertion process of inserting the lead portion 113 into the opening 108, a reflow process associated with forming a solder bond using the solder 114, and/or various other factors.

In these and other example implementations, by inserting the lead 112 into the opening 108 to be bonded to the first pattern portion 106a and the second pattern portion 106b using the solder 114, the configuration of FIG. 1 avoids the above-referenced difficulties associated with attempting to solder bond parallel, coplanar surfaces of a conductive layer and a corresponding lead. Instead, as shown and described, the lead 112 may be securely encapsulated and bonded within the opening 108, with an end portion of the lead portion 113 being positioned between a surface of the patterned conductive layer 106 and a surface of the insulating layer 104.

The described configuration may be obtained without requiring external pressure to be applied during bonding or reflow, and without requiring significant diligence or effort with respect to maintaining planarity of the patterned conductive layer 106 relative to the lead 112 or the lead portion 113. Accordingly, the connection between the lead 112 and the first pattern portion 106a and/or the second pattern portion 106b may be formed in a fast, efficient, reliable, and cost-effective manner.

FIG. 2 is a simplified top view of an example implementation of the example of FIG. 1. In the example of FIG. 2, an insulating layer 204 has a patterned conductive layer 206 formed thereon. For example, as described, the patterned conductive layer 206 may represent an upper copper layer of a DBC substrate.

The pattern of the patterned conductive layer 206 in FIG. 2 is merely illustrative, and demonstrates that virtually any desired pattern may be stenciled to conform to overall package requirements for the semiconductor device package being assembled. In particular, virtually any desired type, number, or positioning of opening(s) may be formed to enable the type of lead insertion described above with respect to FIG. 1.

For example, to mount a leadframe 210 having leads 212*a* and 212*b*, a groove 208*a* and a hole 208*b* may be formed. As shown, the lead 212*a* may be inserted into the groove 208*a* and bonded to a first pattern portion 206*a* and a second pattern portion 206*b* using solder 214*a*. Similarly, the lead 212*b* may be inserted into the hole 208*b* and bonded to a first pattern portion 206*c* and a second pattern portion 206*d* using solder 214*b*.

Thus, as referenced above, FIG. 2 illustrates that the first pattern portion 206*a* and the second pattern portion 206*b* may be separated from one another on the insulating layer 204, with the groove 208*a* formed therebetween. In contrast, the first pattern portion 206*c* and the second pattern portion 206*d* may be connected to one another on the insulating layer 204, with the hole 208*b* formed therebetween.

Figure 3:
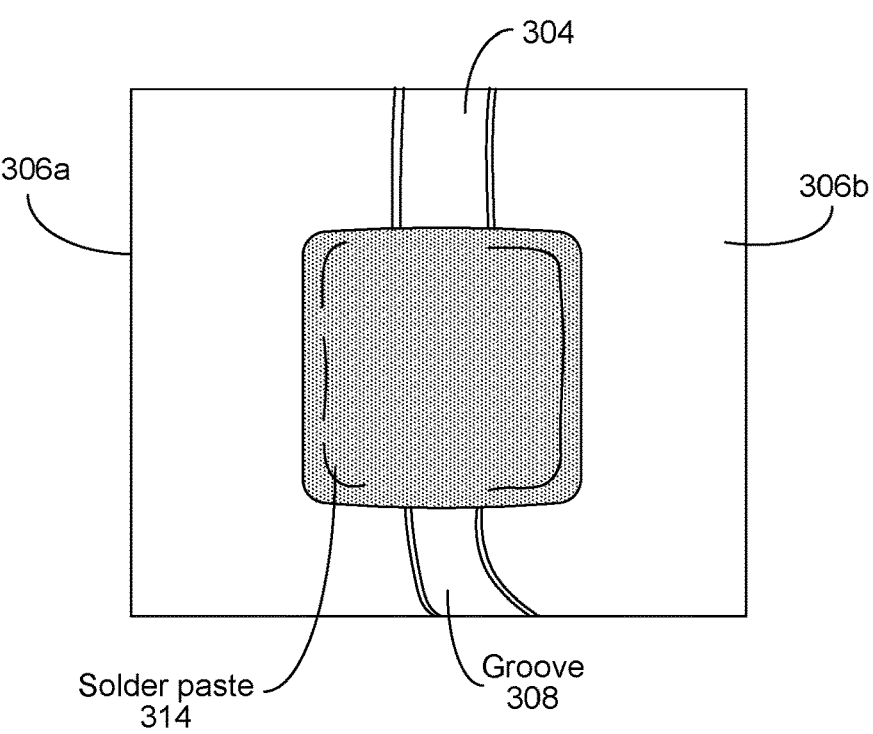
FIG. 3 is an example top view of the example of FIG. 1, during an example lead insertion process, and prior to lead insertion.

FIG. 3 is an example top view of the example of FIG. 1, during an example lead insertion process, and prior to lead insertion. In the example of FIG. 3, groove 308 is defined between a first pattern portion 306*a* and a second pattern portion 306*b*, exposing an insulating layer 304. For example, the first pattern portion 306*a* and the second pattern portion 306*b* may be copper, and the insulating layer 304 may be ceramic. Solder paste 314 is illustrated as being printed within the groove 308 and partially on the first pattern portion 306*a*, the second pattern portion 306*b*, and the insulating layer 304.

Figure 4:
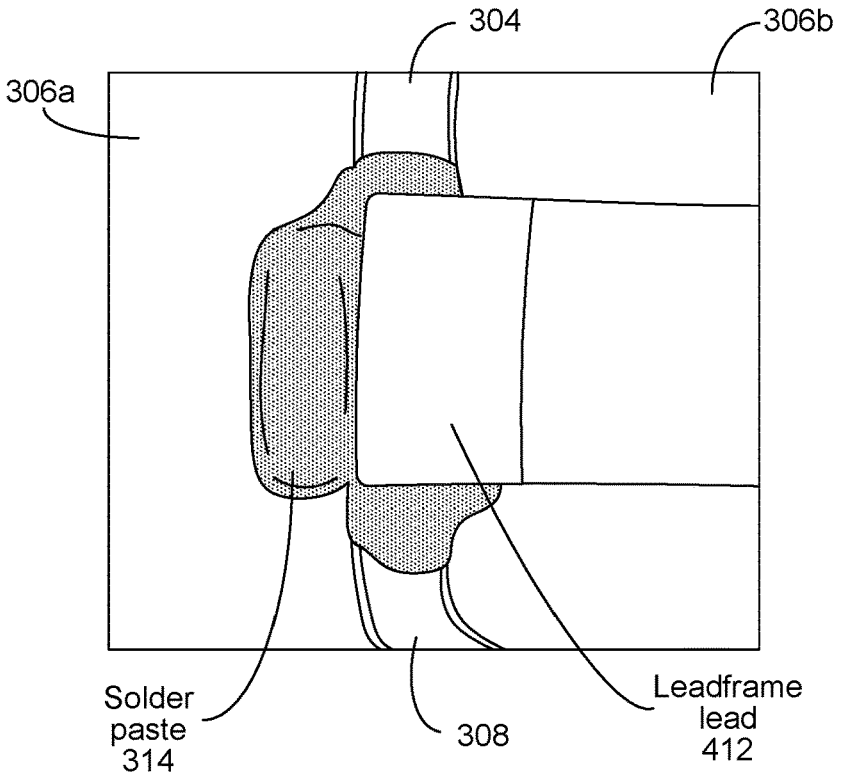
FIG. 4 is an example top view of the example of FIG. 1, during an example lead insertion process, following lead insertion and prior to a reflow process.

FIG. 4 is an example top view of the example of FIG. 1, during an example lead insertion process, following lead insertion and prior to a reflow process. That is, following the example of FIG. 3 during a packaging process, a leadframe lead 412 may be inserted into the solder paste 314 within the groove 308.

Figure 5:
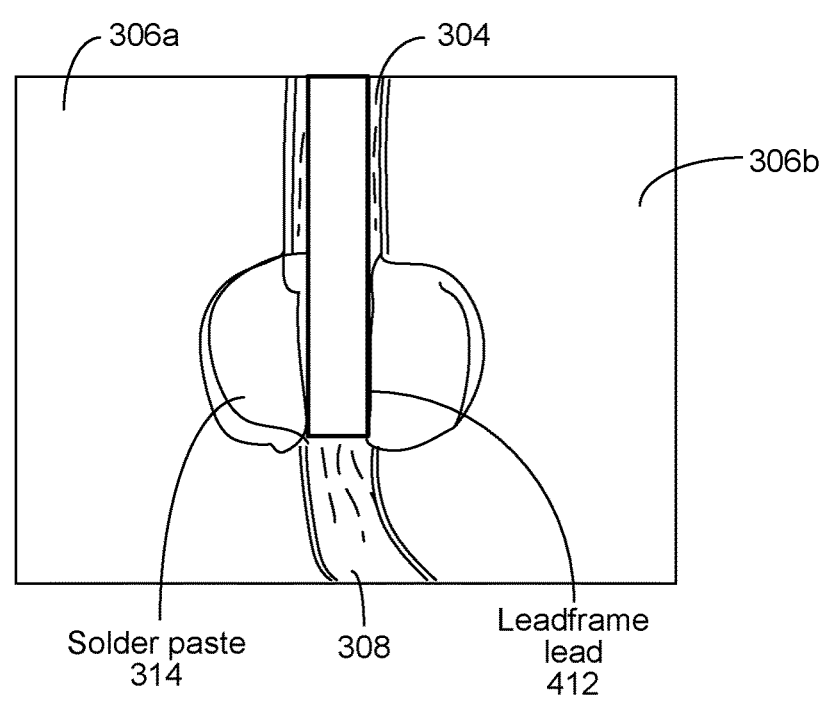
FIG. 5 is an example top view of the example of FIG. 1, during an example lead insertion process, following a reflow process.

FIG. 5 is an example top view of the example of FIG. 1, during an example lead insertion process, following a reflow process. Such a reflow process, as referenced above and described in more detail, below with respect to FIG. 9, may involve one or more heating stages that wet or melt the solder paste 314. Upon drying, the solder paste 314 may thus be bonded to the leadframe lead 412. As indicated by dashed lines in the groove 308, some of the solder paste 314 may melt into the groove 308.

FIG. 6 is a side view of the example of FIG. 5, which illustrates a lower or bottom conductive layer 602 (e.g., copper). FIG. 6 illustrates that the leadframe lead 412 need not be completely perpendicular to the insulating layer 304, and may be non-parallel with (i.e., positioned at an angle with respect to) walls of the groove 308. As also illustrated in FIG. 6, the solder 314 may be formed at least partially on a surface of the insulating layer 304 within the groove 308.

FIG. 7 is a simplified side view of a first alternate example implementation of the example of FIG. 1. FIG. 7 illustrates a DBC substrate having a copper layer 702, a ceramic layer 704, and a patterned copper layer 706. The patterned copper layer 706 includes a first pattern portion 706*a* and a second pattern portion 706*b* that define a groove 708.

In the example of FIG. 7, a leadframe lead 712 is illustrated as a L type lead having a right angle that defines a lead post 713 that is substantially perpendicular to a lead body 711. As shown, and as described above with respect to FIGS. 1-6, the lead post 713 may be inserted into solder paste 714 within the groove 708. As also described above, the lead body 711 and the lead post 713 need not be maintained at exactly 90 degrees. For example, the lead body 711 and the lead post 713 may be positioned at angles of between, e.g., 45 degrees and 125 degrees. More generally, the lead body 711 may be formed at any desired angle to the lead post 713.

FIG. 8 is a simplified side view of a second alternate example implementation of the example of FIG. 1. FIG. 8 illustrates a DBC substrate having a copper layer 802, a ceramic layer 804, and a patterned copper layer 806. The patterned copper layer 806 includes a first pattern portion 806*a* and a second pattern portion 806*b* that define a groove 808.

In the example of FIG. 8, a leadframe lead 812 is illustrated as a Z type lead with a first lead portion 811, a second lead portion 815, and a third lead portion 813. As shown, the third lead portion 813 may be substantially parallel to the ceramic layer 804 and to the first lead portion 811, with the second lead portion 815 being substantially perpendicular to both.

As noted above, e.g., with respect to FIG. 7, it is not necessary to maintain right angles between the second lead portion 815 and either of the first lead portions 811 and the third lead portion 813. That is, Z-type lead 812 of FIG. 8 may have a Z-shape with the first lead portion 811 formed at a first angle to the second lead portion 815, and the third lead portion 813 formed at a second angle with the second lead portion 815, with the third lead portion 813 at least partially inserted into the groove 808 and bonded to the first pattern portion 806*a* and the second pattern portion 806*b* using the solder paste 814.

In comparing the examples of FIGS. 7 and 8, the groove 708 may be formed at a relatively smaller size (e.g., 0.5-1.0 mm), whereas the groove 808 may be relatively larger (e.g., 1.0-1.5 mm). The vertical lead post 713 and the third lead portion 813 may have a width that is a desired portion or percentage of these widths of the respective openings 708 and 808. In other words, a relative width of the vertical lead post 713 and the opening 708, and a relative width of the third lead portion 813 and the opening 808 may be selected as a matter of design choice. Many other example implementations and configurations of leadframes and associated leads are possible, depending on various factors such as available groove sizes and configurations.

Figure 9:
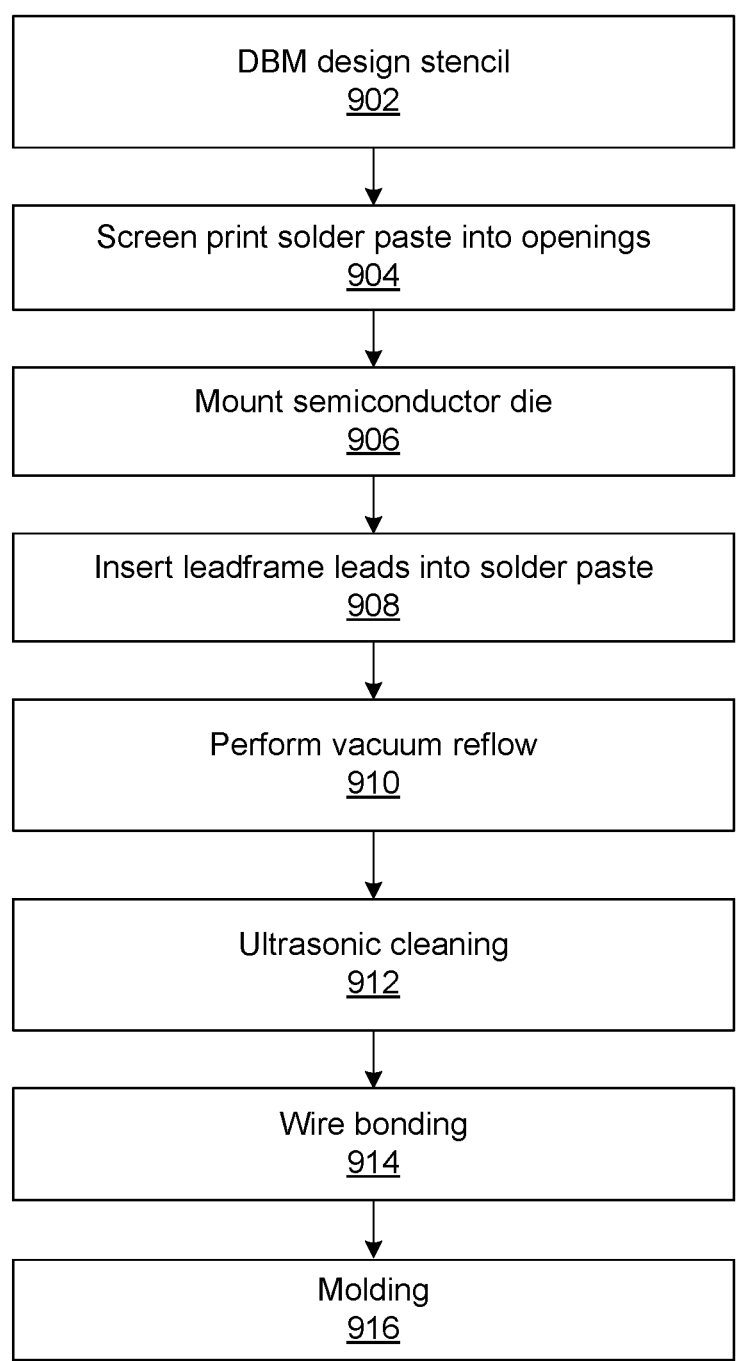
FIG. 9 is a flowchart illustrating an example assembly process flow for manufacturing the example semiconductor device package of FIGS. 1-8.

FIG. 9 is a flowchart illustrating an example assembly process flow for manufacturing the example semiconductor device package of FIGS. 1-8. In the example of FIG. 9, a DBM substrate may be designed, e.g., stenciled, with a desired pattern on a top patterned conductive layer (902). For example, the patterned conductive layer 206 of FIG. 2 may be formed, including desired holes, grooves, or other openings.

Then, an appropriate solder paste dispensing tool may be used to screen print solder paste into desired openings (904). For example, solder paste may be dispensed into a groove, as illustrated in FIG. 3.

In the example of a DBC, a solder paste with good wetting with copper and poor wetting with ceramic may be used, such as a solder paste, so that the solder paste may flow to copper during a melting process, and bond between a leadframe lead and DBC copper following a reflow process, as referenced above and described below in more detail.

One or more semiconductor die may then be mounted on corresponding leadframe(s) for positioning at desired locations on the patterned conductive layer of the DBC substrate (906). To attach the leadframes to the DBM, the various leadframe leads may be inserted into the previously-deposited solder paste (908).

For example, the leadframe leads may be bent or otherwise adjusted or formed to obtain a desired shape that corresponds to an opening to be used, as shown in FIGS. 7 and 8. A suitable machine downset may be used to insert end portions of the leadframe leads into corresponding openings with the previously-deposited solder paste. For example, an otherwise conventional machine downset may be used, but adjusted to position the various leadframe leads relative to the solder paste and openings as described herein.

Then, a vacuum reflow may be performed (910). The vacuum reflow process heats and at least partially melts the previously-deposited solder paste, thereby bonding the inserted leadframe leads with their respective pattern portions of the patterned conductive layer of the DBC substrate.

During subsequent operations, ultrasonic cleaning of the DBC substrate and mounted dies may be performed (912). Wire bonding of the DBC substrate with mounted dies for connections to external circuits may be performed (914). Finally in the example of FIG. 9, a suitable molding material may be applied to encapsulate and secure the semiconductor device package (916).

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A method of making a semiconductor device package, comprising:
   patterning a patterned conductive layer on an insulating layer of a substrate, the patterned conductive layer including at least a first pattern portion and a second pattern portion;
   applying solder paste within an opening between the first pattern portion and the second pattern portion and at least partially on the insulating layer;
   positioning a leadframe on the patterned conductive layer;
   inserting a lead of the leadframe within the solder paste; and
   heating the solder paste to solder bond the lead to the first pattern portion and the second pattern portion on the substrate with the lead inserted into the opening.

2. The method of claim 1, wherein the patterning of the patterned conductive layer on the insulating layer comprises patterning the first pattern portion and the second pattern portion separated from one another on the insulating layer with the opening formed as a groove between the first pattern portion and the second pattern portion.

3. The method of claim 1, wherein the patterning of the patterned conductive layer on the insulating layer comprises patterning the first pattern portion and the second pattern portion connected to one another on the insulating layer with the opening formed as a hole between the first pattern portion and the second pattern portion.

4. The method of claim 1, wherein the heating the solder paste comprises:
   performing a vacuum reflow process.

5. The method of claim 1, further comprising:
   positioning at least one semiconductor device on the lead; and
   encapsulating the at least one semiconductor device, the lead, and the substrate with a molding material.

6. A method of making a semiconductor device package, comprising:
   forming a substrate having an insulating layer with a patterned conductive layer formed thereon, the patterned conductive layer including at least a first pattern portion and a second pattern portion; and
   providing a leadframe on the patterned conductive layer with a lead that is soldered to the first pattern portion and the second pattern portion on the substrate with solder provided at least partially on the insulating layer in an opening between the first pattern portion and the second pattern portion and with the lead inserted into the opening.

7. The method of claim 6, further comprising:
   inserting an end portion of the lead into the opening and positioned between a surface of the patterned conductive layer and a surface of the insulating layer.

8. The method of claim 6, further comprising:
   forming the solder at least partially on a surface of the insulating layer within the opening.

9. The method of claim 6, wherein the first pattern portion and the second pattern portion are separated from one another on the insulating layer, the opening is a groove formed between the first pattern portion and the second pattern portion, and further comprising:

bonding an end portion of the lead by the solder to walls of the groove.

10. The method of claim 6, wherein the first pattern portion and the second pattern portion are connected to one another on the insulating layer, the opening is a hole formed within the patterned conductive layer, and further comprising:

bonding an end portion of the lead by the solder to walls of the hole.

11. The method of claim 6, further comprising:

forming the patterned conductive layer on a first side of the insulating layer; and forming a conductive layer on an opposed second side of the insulating layer.

12. The method of claim 11, wherein the substrate is a direct bonded metal (DBM) substrate, in which the patterned conductive layer and the conductive layer are formed using copper and the insulating layer is formed using a ceramic material.

13. The method of claim 6, wherein the lead includes a lead post and a lead body, and further comprising:

inserting the lead post into the opening and bonded to the first pattern portion and the second pattern portion using the solder; and forming the lead body at an angle to the lead post.

14. The method of claim 6, further comprising:

forming the lead with a Z-shape having a first portion formed at a first angle to a second portion, and a third portion formed at a second angle with the second portion; and at least partially inserting the third portion into the opening and bonded to the first pattern portion and the second pattern portion using the solder.

15. A method of making a semiconductor device package, comprising:

forming a substrate having an insulating layer with a patterned conductive layer formed thereon, the patterned conductive layer including at least a first pattern portion and a second pattern portion; and forming a leadframe positioned on the patterned conductive layer and having a lead with a lead end portion that is inserted into an opening between the first pattern portion and the second pattern portion, and that is soldered to at least one wall of the opening and to the insulating layer.

16. The method of claim 15, wherein the first pattern portion and the second pattern portion are separated from one another on the insulating layer, and the opening is a groove formed between the first pattern portion and the second pattern portion.

17. The method of claim 15, wherein the first pattern portion and the second pattern portion are connected to one another on the insulating layer, and the opening is a hole formed within the patterned conductive layer.

18. The method of claim 15, further comprising:

forming the lead end portion at an angle to a lead body of the lead.

19. The method of claim 15, further comprising:

providing the lead with a Z-shape having a first portion formed at a first angle to a second portion, and with the lead end portion formed at a second angle with the second portion.

20. The method of claim 15, further comprising:

forming the patterned conductive layer on a first side of the insulating layer; and forming a conductive layer on an opposed second side of the insulating layer.

* * * * *